United States Patent

Sezi et al.

[11] Patent Number: 5,851,733
[45] Date of Patent: Dec. 22, 1998

[54] PHOTOLITHOGRAPHIC PATTERN GENERATION

[75] Inventors: Recai Sezi, Röttenbach; Rainer Leuschner; Erwin Schmidt, both of Erlangen, all of Germany

[73] Assignee: Siemens Aktiengesellschaft, München, Germany

[21] Appl. No.: 793,310

[22] PCT Filed: Sep. 1, 1995

[86] PCT No.: PCT/DE95/01184

§ 371 Date: Mar. 12, 1997

§ 102(e) Date: Mar. 12, 1997

[87] PCT Pub. No.: WO96/08750

PCT Pub. Date: Mar. 21, 1996

[30] Foreign Application Priority Data

Sep. 12, 1994 [DE] Germany ............... 44 32 446.4

[51] Int. Cl.⁶ .................................. B03C 5/00
[52] U.S. Cl. .............. 430/311; 430/270.1; 430/326; 430/919; 430/330
[58] Field of Search ................ 430/270.1, 910, 430/326, 311, 330

[56] References Cited

U.S. PATENT DOCUMENTS

| | | | |
|---|---|---|---|
| 5,114,816 | 5/1992 | Scheler et al. | 430/192 |
| 5,124,228 | 6/1992 | Uetani et al. | 430/192 |
| 5,294,521 | 3/1994 | Jacovich et al. | 430/326 |
| 5,314,782 | 5/1994 | Lazarus et al. | 430/165 |
| 5,384,220 | 1/1995 | Sezi et al. | 430/8 |
| 5,395,728 | 3/1995 | Jacovich et al. | 430/192 |
| 5,506,088 | 4/1996 | Nozaki et al. | 430/270.1 |
| 5,556,734 | 9/1996 | Yamachika et al. | 430/270.1 |

OTHER PUBLICATIONS

Przybilla, K.J., "Delay Time Stable Chemically Amplified Deep UV Resist", Proc. SPIE, vol. 1925 (1993), pp. 76–91.
Schwalm, R., "A Robust and Enviromentally Stable Deep UV Positive resist: Optimisation of Success ST2", Proc. SPIE, vol. 2195 (1994), pp. 2–13.

Jagannathan, P., "Environmentally Stable Chemically amplified DUV resist based on Diazoketone Chemistry", Proc. SPIE, vol. 2195 (1994), pp. 28–36.

"Resist Pattern Formation–by forming Photosensitive layer, comprising alkali–soluble resin and monofunctional naphthoquinone–di:azide as photosensitive agent giving improved resolution, on substrate and exposing", WPI/Derwent Publications, London, GB, AN 93–021675.

MacDonald, S. et al., "Airborne Chemical Contamination of a Chemically Amplified Resist", Proc. SPIE vol. 1466 (1991), pp. 2–12.

Nalamasu, O. et al., "Preliminary Lithographic Characteristics of an All–Organic Chemically Amplified Resist Formulation for Single Layer Deep–UV Lithography", Proc. SPIE, vol. (1966), pp. 13–25.

"Chemically Amplified Resists", Lamola, A.A., Solid State Technology, 1991, vol. 34, No. 8, 53–60.

Methods and Materials in Microelectronic Technology, Bargon, J., Plenum Press, NY 1984, pp. 190–193.

*Primary Examiner*—Janet C. Baxter
*Assistant Examiner*—Rosemary Ashton
*Attorney, Agent, or Firm*—Kenyon & Kenyon

[57] ABSTRACT

In a method for producing photolithographic patterns in the submicron range, applied on a substrate is a photoresist layer comprised of a polymer containing carboxylic acid anhydride groups and tert. butylester or tert. butoxy-carbonyloxy groups, a photoactive component—in the form of an ester of a naphthoquinonediazide-4-sulfonic acid with an aromatic or aliphatic-aromatic hydroxy compound—and a suitable solvent; the photoresist layer is then dried, exposed in an imaging manner, and subjected to a temperature treatment in the range of between 120° and 150° C. for a duration of 100 to 600 seconds. The photoresist layer is then subjected to a liquid silylation and is dry-developed in an anisotropic oxygen plasma.

10 Claims, No Drawings

PHOTOLITHOGRAPHIC PATTERN GENERATION

The invention relates to a method for producing photolithographic patterns—using a dry developable single-layer resist system—in the submicron range.

"Chemically amplified resists" are widely used in microelectronics (see "Solid State Technology", vol. 34 (1991), no. 8, pp. 53 to 60). The chemical amplification is performed both when working with wet-developable single-layer resists, as well as with wholly or partially dry-developable resists. The resists are able to work in accordance with the principle of cleavage by acid catalysis, polar, but blocked chemical groups, such as carboxyl groups or phenolic hydroxyl groups being deblocked by a photolytically produced acid, and the resist undergoing a polarity change in the exposed regions. This polarity change can be used for a selective silylation when working with dry-developable resists, for example. Examples of blocking groups are tert. butylester and tert. butoxy-carbonyloxy groups.

Published European Patent application 0 492 256 discloses a photolithographic pattern generation, where a dry-developable resist is subjected to a temperature treatment following irradiation (post exposure bake=PEB) and is then silylated from the liquid phase and subsequently anisotropically etched in an oxygen plasma. Positive or negative patterns are produced depending on the type of silylation solution. The resist is generally comprised of at least two solid constituents, i.e., of a base polymer and a photoactive acid former. The base polymer contains carboxylic acid anhydride and tert. butylester partial structures, the acid former is preferably an onium compound, such as diphenyliodonium- and triphenylsulfonium-trifluoromethanesulfonate. A resist of this type is especially suited for photopatterning in the sub-micron and subhalf-micron range with very steep side walls. In a pattern generation carried out in the manner described above, the so-called "delay time" effect was ascertained—in the same way as in other known resist systems which work according to the principle of acid-catalyzed cleavage. Namely, if the delay time between exposure and temperature treatment (PEB) exceeds a certain value, considerable discrepancies occur between the nominal pattern dimension (pattern size on the mask) and the imaged pattern (pattern size in the resist following development). The longer this delay time is, the greater the discrepancy. Above a certain value for the time delay, for example about 30 minutes, in the case of anhydride group-containing resists of the type mentioned above, almost no patterns are recognizable after development. The tolerable delay time for these resists is approximately 5 to 10 minutes. From a standpoint of production engineering, however, a delay time of this kind is not acceptable.

The problem portrayed here is generally known and is attributed to alkaline contamination in the air, which deactivates the photochemically produced strong acid during the delay time. It has already been proposed, therefore, to solve this problem by filtering the air using activated carbon (see: "Proc. SPIE", vol. 1466 (1991), pp. 2–12). However, this requires considerable investment.

Other measures, such as admixing additives, also have not resulted in a decisive attenuation of the delay time effect (see: "Proc. SPIE", vol. 1466 (1991), pp. 13–25). The delay time can, in fact, be prolonged by applying an additional layer, but only to a minor extent. Moreover, such a measure constitutes an additional process step, which is not desirable in a production because it leads to loss of efficiency.

The object of the invention is to disclose a method that operates on the principle of acid-catalyzed cleavage—for photolithographic pattern generation, which—when working with resist systems of the type mentioned at the outset—will enable the delay time problem to be solved without entailing additional process steps or investments; i.e., the delay time between irradiation and temperature treatment (of a value of approx. 10 minutes) to be increased to a level that is acceptable in terms of production engineering.

SUMMARY OF THE INVENTION

This is achieved in accordance with the invention in that applied on a substrate is a photoresist layer comprised of
- a polymer containing carboxylic acid anhydride groups and tert. butylester or tert. butoxy-carbonyloxy groups,
- a photoactive component in the form of an ester of a naphthoquinonediazide-4-sulfonic acid having a structure of

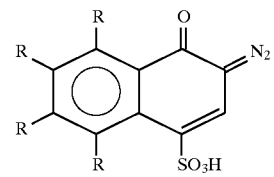

with an aromatic or aliphatic-aromatic hydroxy compound, the residues R signifying—independently of one another—hydrogen, alkyl, halogenalkyl, alkoxy, phenyl, halogenphenyl, phenoxy or halogen, and a suitable solvent;
- that the photoresist layer is dried;
- that the photoresist layer is exposed in an imaging manner;
- that the exposed photoresist layer is subjected to a temperature treatment in the range of between 120° and 150° C. for a duration of 100 to 600 seconds;
- that the thus treated photoresist layer undergoes a liquid silylation; and
- that the silylated photoresist layer is dry-developed in an anisotropic oxygen plasma.

Underlying the method according to the invention is a dry-developable, stable-in-storage, single-layer resist, i.e., a negative resist, on the basis of a polymer, which—besides anhydride groups—possesses tert. butylester or tert. butoxy-carbonyloxy groups. The advantage of a resist of this type is that it is not only effective in the deep UV range (DUV), but in the near UV range (NUV), as well.

The photoactive component of the resist is an ester from a naphthoquinonediazide-4-sulfonic acid and a hydroxy compound. Photoactive components of this type are known per se (see: "Methods and Materials in Microelectronic Technology", Plenum Press, New York (1984), pp. 190–193). In the case of the invention, however, the excellent patternability of the resist containing such a photoactive component is surprising. As a rule, namely, very strong acid formers are required when working with tert. butylester base polymers in photolithographic pattern generation.

It is essential in the method according to the invention for the temperature treatment (PEB) to take a relatively long time, namely $\geq 100$ s, i.e., between 100 and 600 seconds, and for the PEB temperature to be relatively high, namely 120°–150° C. This method results in a prolongation of the delay time of up to 16 h and more. The delay time problem is solved without requiring new process steps or new materials and without necessitating new investments.

In comparison to common resists, the proportion of photoactive component in the case of the invention is much higher. This proportion is advantageously 20 to 40% by mass, preferably 25 to 35% by mass, relative to the dry photoresist, i.e., the solvent-free resist composition. The photoactive component can also advantageously be a mixture of an ester of the mentioned type and an onium compound. Compounds of this type, also described as Crivello salts, are, for example, diphenyliodonium-trifluoromethane sulfonate (DPIT) and triphenylsulfonium-trifluoromethane sulfonate (TPST).

Preferably 2,3,4-trihydroxybenzophenone or bisphenol A is used as a hydroxy compound in the ester of the photoactive component.

In the method according to the invention, the polymers used are preferably-those whose carboxylic acid anhydride groups are derived from maleic anhydride. Another compound of this type is, for example, itaconic acid anhydride. The carboxylic acid tert.-butylester groups are preferably based on acrylic acid, methacrylic acid, vinylbenzoic acid, or cinnamic acid-tert.-butylester, and the tert.-butoxycarbonyloxy groups preferably on tert.-butoxycarbonyloxystyrene or—maleinimide.

Generally known resist solvents are suited for use as solvents. The sole important criterion for selecting the solvent is that both the polymer component as well as the photoinitiator, i.e., the photoactive component, have to be dissolved. Moreover—using the known coating methods—faultless resist layers must be formed on the substrates, for example on silicon wafers or on wafers coated with a bottom resist. The solvent is preferably methoxypropylacetate, cyclohexanon or an ethylene glycol- or diethylene glycol-ether, if indicated in a mixture with dibenzyl ether.

An etching resistance to dry development in the oxygen plasma is effected by means of liquid silylation with the method according to the invention. To this end, the resist layer is treated with a polar, protic silylation solution. As a silylating agent, generally silicon compounds in the form of aminosilanes or aminosiloxanes are used; these compounds can be of an oligomeric nature. The polar, protic silylation solution is preferably an aqueous-organic solution of the silylating agent. The silylating agent is advantageously dissolved in mixtures of water and alcohol, in particular ethanol and/or isopropanol; besides that, for example, pure alcoholic solutions can be used.

The invention shall be elucidated further on the basis of exemplary embodiments. The following starting materials or reagents are used:

Base polymer

Terpolymer of cinnamic acid tert.-butylester, maleic anhydride and stilbene, prepared through radical polymerization of the three monomers in ethyl acetate with azoisobutyric acid nitrile as an initiator.

Photoactive component (1)

Triester of 2,3,4-trihydroxybenzophenone with naphthoquinonediazide-4-sulfonic acid.

Photoactive component (2)

Diphenyliodonium-trifluoromethane sulfonate (DPIT)

Silylation solution (1)

Aqueous-alcoholic solution comprising 2 parts by weight diaminosiloxane, 78 parts by weight isopropanol and 20 parts by weight of water; preferably a α,ω-aminofunctional siloxane, in particular with two terminal aminopropyl groups and 2 to 20 silicon atoms in the chain, is used, for example the commercial product Tegomer A-Si 2120 (firm Goldschmidt).

Silylation solution (2)

Alcoholic solution comprising 1 part by weight diaminosiloxane (Tegomer A-Si 2120) and 99 parts by weight ethanol.

EXAMPLE 1

A resist consisting of 9 parts by weight of base polymer, 3 parts by weight of photoactive component (1), 79.2 parts by weight of methoxypropylacetate and 8.8 parts by weight of dibenzyl ether is spin-coated onto a silicon wafer and dried for 90 seconds at 90° C. on a heating plate; the layer thickness of the resist is 0.52 $\mu$m. The resist is then contact-exposed through a mask with 12 mJ/cm unit MJB 3, firm Karl Süss; $\lambda$=250 nm) and baked immediately thereafter for 120 seconds at 135° C. on the heating plate (PEB). The resist is subsequently treated at room temperature and under a normal pressure, i.e., under ordinary room climate conditions, for 45 seconds with the silylation solution (1), and then rinsed for 30 seconds with isopropanol and subsequently dried for 90 seconds at 90° C. on the heating plate. After drying, the wafer is placed in a plasma etching installation (type MIE 720, firm Material Research Corporation), and the resist is then etched with a plasma that contains oxygen (gas flow: 80 sccm) and tetrafluoromethane (gas flow: 9 sccm); the total gas pressure is 8 mTorr; the bias voltage is 40 V. Etching takes place subsequently in a pure oxygen plasma (gas pressure: 2 mTorr; bias voltage: 50 V). Negative patterns are obtained with vertical side walls and a line/space ratio of 1:1.

EXAMPLE 2

One proceeds as in Example 1, however, the wafer is left between exposure and tempering for 16 hours in an open wafer tray in the process room. Negative patterns having vertical side walls, and a line/space ratio of 1:1 are likewise obtained after etching. Microscopic examinations reveal that patterns of the same nominal width on the etched wafers have the same width in Example 1 and Example 2.

EXAMPLE 3

(comparative test)

A resist consisting of 11.1 parts by weight of base polymer, 0.9 parts by weight of photoactive component (2), 79.2 parts by weight of methoxypropylacetate and 8.8 parts by weight of dibenzyl ether is spin-coated onto a silicon wafer and dried for 90 seconds at 90° C. on a heating plate; the layer thickness of the resist is 0.58 $\mu$m. The resist is then contact-exposed through a mask with 12 mJ/cm$^2$ (unit MJB 3, firm Karl Süss; $\lambda$=250 nm) and baked immediately thereafter for 60 s at 100° C. on the heating plate (PEB). The resist is subsequently treated at room temperature and under a normal pressure, i.e., under ordinary room climate conditions, for 20 seconds with the silylation solution (2), and then rinsed for 20 seconds with isopropanol and subsequently dried for 90 seconds at 90° C. on the heating plate. After drying, the resist is etched in a plasma etching installation as in Example 1. Negative patterns are obtained with vertical side walls and a line/space ratio of 1:1.

EXAMPLE 4

(comparative test)

One proceeds as in Example 3, however, the wafer is left between exposure and tempering for 1 hour in an open wafer tray in the process room. No unequivocal patterning can be ascertained following the etching, i.e., the delay time problem occurs in this case.

What is claimed is:

1. A method for producing photolithographic patterns in the submicron range, comprising the steps of:
   applying onto a substrate a photoresist layer comprising
     a polymer containing carboxylic acid anhydride groups and tert. butylester or tert. butoxy-carbonyloxy groups,
     a photoactive component in the form of an ester of a naphthoquinonediazide-4-sulfonic acid having a structure of

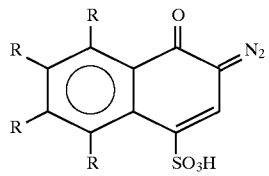

with an aromatic or aliphatic-aromatic hydroxy compound, the residues R signifying—independently of one another—hydrogen, alkyl, halogenalkyl, alkoxy, phenyl, halogenphenyl, phenoxy or halogen, and a suitable solvent;
   drying the photoresist layer;
   exposing the photoresist layer in an imaging manner;
   subjecting the exposed photoresist layer to a temperature treatment in the range of between 120° and 150° C. for a duration of 100 to 600 seconds;
   subjecting the thus treated photoresist layer to liquid silylation; and
   dry-developing the silylated photoresist layer in an anisotropic oxygen plasma.

2. The method as defined by claim 1, wherein the hydroxy compound is 2,3,4-trihydroxybenzophenone or bisphenol A.

3. The method as defined by claim 1, wherein the proportion of the photoresist in terms of the photoactive component is 20 to 40%.

4. The method as defined by claim 1, wherein an onium compound is added to the photoactive component.

5. The method as defined by claim 1, wherein the liquid silylation takes place with a polar, protic silylation solution.

6. The method as defined by claim 5, wherein as a silylation solution, a solution of an aminosiloxane in a mixture of water and alcohol is used.

7. The method as defined by claim 1, wherein a polymer is used, whose carboxylic acid anhydride groups are based on maleic anhydride.

8. The method as defined by claim 7, wherein a terpolymer of maleic anhydride, cinnamic acid tert.-butylester, and stilbene is used.

9. The method as defined by claim 1, wherein a polymer is used, whose tert.-butylester groups are based on acrylic acid, methacrylic acid, vinylbenzoic acid, or cinnamic acid-tert.-butylester.

10. The method as defined by claim 1, wherein a polymer is used, whose tert.-butoxycarbonyloxy groups are based on tert.-butoxycarbonyloxystyrene or -maleinimide.

* * * * *